US007371591B2

(12) United States Patent
Ono

(10) Patent No.: US 7,371,591 B2
(45) Date of Patent: May 13, 2008

(54) PROCESS FOR MANUFACTURING LIQUID EJECTION HEAD

(75) Inventor: Shogo Ono, Kanagawa (JP)

(73) Assignee: Sony Corporation, Tokyo (JP)

( * ) Notice: Subject to any disclaimer, the term of this patent is extended or adjusted under 35 U.S.C. 154(b) by 224 days.

(21) Appl. No.: 11/298,187

(22) Filed: Dec. 9, 2005

(65) Prior Publication Data

US 2006/0134896 A1 Jun. 22, 2006

(30) Foreign Application Priority Data

Dec. 21, 2004 (JP) ........................... P2004-369933

(51) Int. Cl.
*H01L 21/00* (2006.01)

(52) U.S. Cl. ........................... 438/21; 438/976; 216/27

(58) Field of Classification Search ................ 438/745, 438/749, 750, 751, 780, 976, 21; 216/27
See application file for complete search history.

(56) References Cited

U.S. PATENT DOCUMENTS

| | | | | |
|---|---|---|---|---|
| 4,775,445 | A * | 10/1988 | Noguchi | 216/27 |
| 5,331,344 | A * | 7/1994 | Miyagawa et al. | 347/65 |
| 5,458,254 | A * | 10/1995 | Miyagawa et al. | 216/27 |
| 6,123,863 | A * | 9/2000 | Shimomura et al. | 216/27 |
| 6,139,761 | A * | 10/2000 | Ohkuma | 216/27 |
| 6,331,259 | B1 * | 12/2001 | Ozaki et al. | 216/27 |
| 6,390,606 | B1 * | 5/2002 | Terui et al. | 347/63 |
| 6,676,241 | B2 * | 1/2004 | Yabe | 347/20 |
| 6,875,365 | B2 * | 4/2005 | Watanabe et al. | 216/2 |
| 6,993,840 | B2 * | 2/2006 | Mouri et al. | 29/890.1 |
| 7,063,799 | B2 * | 6/2006 | Hayakawa et al. | 216/83 |
| 7,070,912 | B2 * | 7/2006 | Park et al. | 430/320 |
| 7,207,109 | B2 * | 4/2007 | Tokunaga et al. | 29/890.1 |
| 2003/0011655 | A1 * | 1/2003 | Miyagawa et al. | 347/20 |
| 2003/0098900 | A1 * | 5/2003 | Tokunaga | 347/63 |
| 2004/0029305 | A1 * | 2/2004 | Chung et al. | 438/27 |
| 2005/0181309 | A1 * | 8/2005 | Miyagawa et al. | 430/311 |
| 2006/0027529 | A1 * | 2/2006 | Tokunaga | 216/27 |
| 2006/0061626 | A1 * | 3/2006 | Saito et al. | 347/58 |
| 2006/0117564 | A1 * | 6/2006 | Ishikura et al. | 29/890.1 |
| 2006/0243701 | A1 * | 11/2006 | Ono et al. | 216/27 |
| 2006/0262157 | A1 * | 11/2006 | Park et al. | 347/20 |
| 2006/0266733 | A1 * | 11/2006 | Kato | 216/27 |
| 2007/0081048 | A1 * | 4/2007 | Ishikura et al. | 347/65 |
| 2007/0084054 | A1 * | 4/2007 | Tokunaga et al. | 29/890.1 |
| 2007/0126772 | A1 * | 6/2007 | Shim et al. | 347/20 |

* cited by examiner

*Primary Examiner*—M. Wilczewski
(74) *Attorney, Agent, or Firm*—Robert J. Depke; Rockey, Depke & Lyons, LLC.

(57) ABSTRACT

A process includes forming a protective layer in a region of a substrate including a PAD electrode; forming a soluble resin layer in a region including a region on the substrate where an energy generating element has been formed, for forming a liquid chamber; forming a coating resin layer in a region covering the soluble resin layer and a region where an opening is formed above the electrode; forming an opening in the coating resin layer above the energy generating element to form a nozzle; dipping the substrate in an dissolving liquid to dissolve the soluble resin layer; and removing the protective layer after dissolution of the soluble resin layer.

6 Claims, 4 Drawing Sheets

PROCESS FOR MANUFACTURING LIQUID EJECTION HEAD

CROSS REFERENCES TO RELATED APPLICATIONS

The present invention contains subject matter related to Japanese Patent Application JP 2004-369933 filed in the Japanese Patent Office on Dec. 21, 2004, the entire contents of which are incorporated herein by reference.

BACKGROUND OF THE INVENTION

1. Field of the Invention

The invention relates to a process for manufacturing a liquid ejection head including nozzles formed for ejecting a liquid from a liquid chamber. Specifically, the invention relates to a technique for permitting secured dissolution of a soluble resin layer and preventing corrosion of an electrode on a substrate.

2. Description of the Related Art

A usual technique known as a technique for ink jet heads (a type of liquid ejection head) of ink jet printers includes ejecting as ink droplets an ink contained in an ink chamber through nozzles using an energy generating element, and landing the droplets on a recording medium such as printing paper or the like which is disposed opposite to an ink ejection surface to arrange substantially circular dots in a lattice form, thereby expressing a character, a picture, or the like as a dot image.

Examples of a known ink ejection system include a thermal system in which ink is ejected by thermal energy using a heating element (heating resistor) as an energy generating element, a piezo system in which ink is ejected by deformation of a vibrating plate using a piezo element as an energy generating element, and the like. In any one of the systems, the ink contained in an ink chamber is ejected through nozzles.

The structure of this type of liquid ejection head includes liquid chambers, an energy generating element provided in each liquid chamber, nozzles disposed on the energy generating elements, individual flow paths communicating to the respective liquid chambers, a common flow path communicating to the individual flow paths to supply a liquid thereto, etc.

A known method for manufacturing such an ink jet heat includes, for example, forming a soluble resin layer, which may be subsequently dissolved, into an ink chamber pattern on a substrate on which energy generating elements have been disposed, applying a resin solution on the soluble resin layer formed in the ink chamber pattern to form a coating resin layer, and forming nozzles in the coating resin layer and dissolving the soluble resin layer below the coating resin layer to form ink chambers (refer to, for example, Japanese Unexamined Patent Application Publication No. 59-274689).

SUMMARY OF THE INVENTION

However, the above-described technique has the following problem:

As a result of evaluation of printing with a liquid ejection head manufactured by the above-described technique, white stripes occurred possibly due to nonejection of liquid droplets from some of nozzles. Therefore, the ink jet head was disassembled and analyzed. As a result, it was found that the soluble resin layer to be basically removed by dissolution partially remains undissolved in the flow paths, thereby inhibiting an ink flow and forming a portion in which the ink does not reach the nozzles.

Therefore, a dissolving liquid capable of completely removing the soluble resin layer has been studied. As a result, it was found that by using a developer for a photosensitive resist, which is used for the soluble resin layer, as the dissolving liquid, the soluble resin layer may be completely dissolved without leaving an undissolved portion and damaging the coating resin layer.

However, the developer for the photosensitive resin has the problem of corroding a PAD electrode mainly composed of aluminum (Al) due to contact with the dissolving liquid because the developer is an alkaline aqueous solution (2 to 3% aqueous solution of tetramethylammonium hydroxide).

Therefore, it is desirable to provide a process for manufacturing a liquid ejection head capable of completely dissolving a soluble resin layer without corroding an electrode portion with a dissolving liquid for the soluble resin layer, thereby preventing defects such as clogging of flow paths and the like.

In accordance with an embodiment of the invention, there is provided a process for manufacturing a liquid ejection head including an energy generating element formed on a substrate, for applying energy to a liquid; a liquid chamber containing the energy generating element and the liquid to be ejected; a nozzle for ejecting the liquid contained in the liquid chamber; and an electrode formed on the substrate, for achieving electrical connection to the outside. The process includes forming a protective layer in a region of the substrate including the electrode; forming a soluble resin layer in a region including a region of the substrate where the energy generating element has been formed, for forming the liquid chamber; forming a coating resin layer in a region covering the soluble resin layer and a region where an opening is formed above the electrode; forming an opening in the coating resin layer above the energy generating element to form the nozzle; dipping the substrate in an dissolving liquid to dissolve the soluble resin layer; and removing the protective layer after dissolution of the soluble resin layer.

In accordance with the embodiment of the invention, the protective layer is formed on the electrode, and thus when the soluble resin layer is dissolved, the electrode is covered with the protective layer, thereby preventing corrosion of the electrode with the dissolving liquid for the soluble resin layer. Therefore, the soluble resin layer is securely dissolved without the need to give attention to corrosion of the electrode. Also, the protective layer is removed after the dissolution of the soluble resin layer. As a result, the electrode is securely protected.

The process for manufacturing the liquid ejection head according to the embodiment of the invention prevents corrosion of the electrode with the dissolving liquid for the soluble resin layer. Therefore, for example, an aqueous alkaline solution may be used as the dissolving liquid, and the soluble resin layer is completely removed without leaving a residue of the soluble resin layer. As a result, a liquid ejection head causing no clogging of flow paths or the like may be provided.

DESCRIPTION OF THE PREFERRED EMBODIMENTS

Embodiments of the invention will be described below with reference to the drawings.

A liquid ejection head manufactured by a process according to an embodiment of the invention corresponds to an inkjet head 10 for an inkjet printer. In the embodiment, ink is used as a liquid, and the ink is contained in each ink chamber 14. In the embodiment, heating elements (heating resistors) 12 are used as energy generating elements and disposed on a substrate 11. Of course, a liquid ejection head is not limited to the embodiment.

Figure 1:
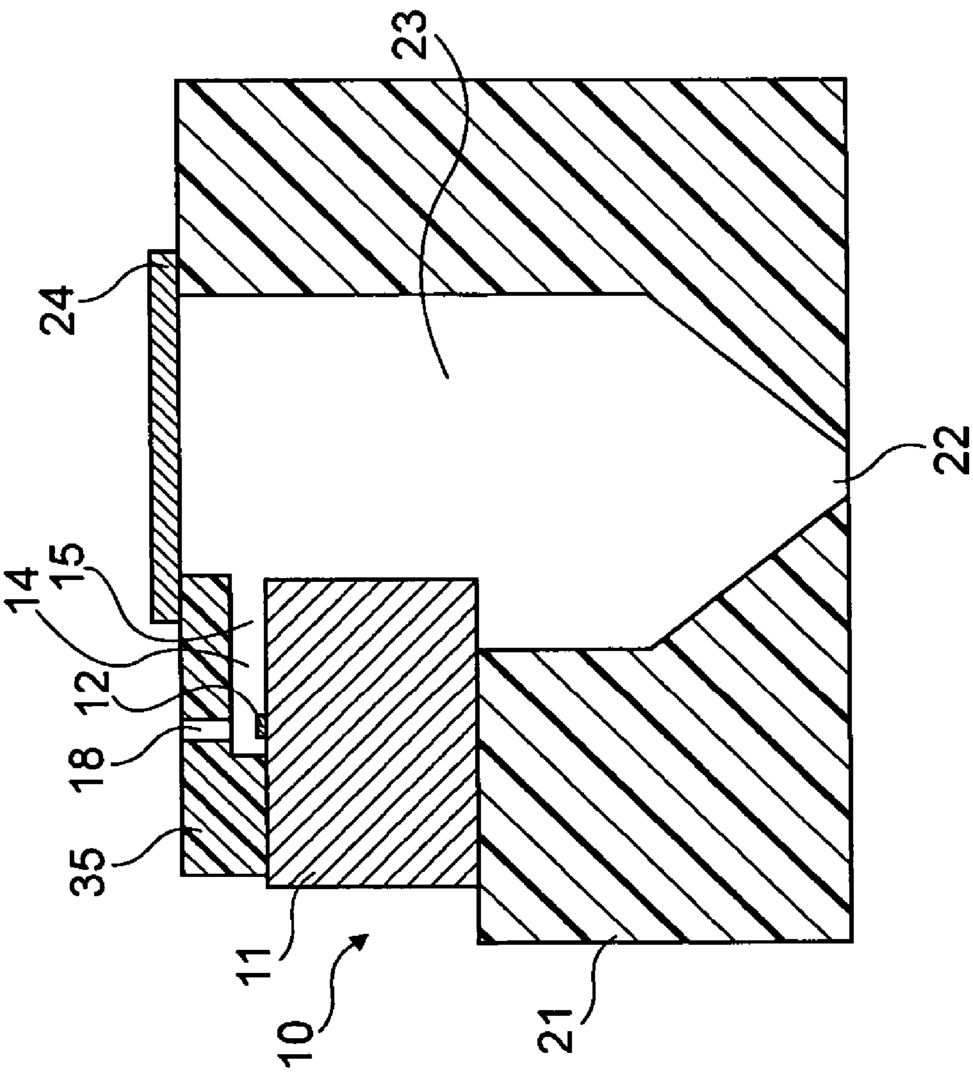
FIG. 1 is a sectional view showing an ink jet head manufactured by a process according to an embodiment of the invention.

As shown in FIG. 1, in the inkjet head 10, the heating elements 12 are disposed on the substrate 11. A plurality of the heating elements 12 is disposed in parallel at a predetermined interval in a direction perpendicular to the drawing. For example, in the inkjet head 10 having a resolution of 600 DPI, the heating elements 12 are arrayed in parallel at an internal of 42.3 μm.

Also, a coating resin layer 35 is formed on the heating elements 12 on the substrate 11. The coating resin layer 35 has a predetermined space formed above the heating elements 12 to form the ink liquid chambers 14. Furthermore, individual flow paths 15 are formed to communicate to the respective ink chambers 14. The individual flow paths 15 also communicate to a common flow path 23 which will be described below.

Furthermore, nozzles 18 are formed in the coating resin layer 35 above the respective heating elements 12.

The substrate 11 is attached to an ink supply member 21 which has a hole vertically extending to form a supply port 22 at the bottom of the hole and the common flow path 23 in the hole. In addition, a top plate 24 is provided between the coating resin layer 35 and the ink supply member 21 to seal the common flow path 23.

In the inkjet head 10 having the above-described constitution, the ink supplied through the supply port 22 is sent to the ink chambers 14 through the common flow path 23 and the individual flow paths 15.

On the other hand, drive of the heating elements 12 is controlled by a control unit (not shown) so that when the heating elements 12 are rapidly heated, bubbles occur above the heating elements 12 in the ink chamber 14, and the ink is ejected as droplets from the nozzles 18 by the flying force generated due to growth of the bubbles. Each of the ink chambers 14 is filled with the ink in an amount corresponding to the amount of the ejected droplets from the corresponding individual flow path 15.

Next, a process for manufacturing an inkjet head according to another embodiment of the invention will be described.

Figure 2:
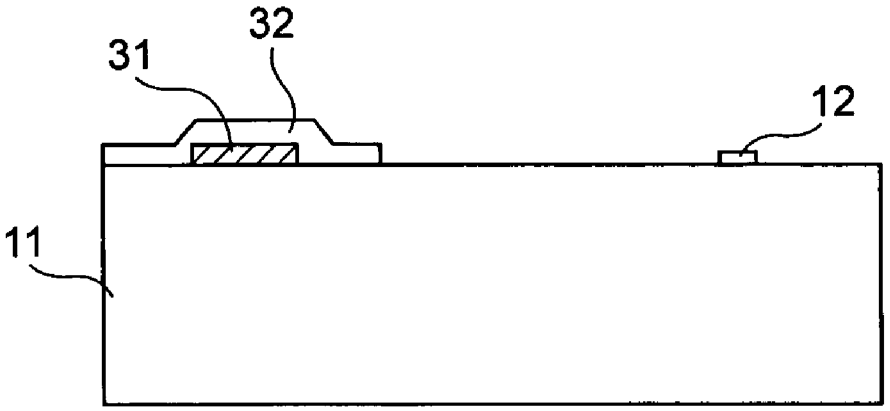
FIG. 2 is a sectional view showing a state in which a protective layer is formed on a PAD electrode.

First, as shown in FIG. 2, heating elements 12 (corresponding to energy generating elements) are formed on a substrate 11 made of silicon, glass, ceramic, or the like using, for example, a fine processing technique for semiconductors and electronic devices.

Also, a PAD electrode 31 composed of photoresistive resist is formed on the substrate 11.

Next, a protective layer 32 is formed on the PAD electrode 31. The protective layer 32 is formed by spin coating and photolithographic patterning to leave a film on the PAD electrode 31. The thickness of the protective layer is about 1 to 2 μm.

Figure 3:
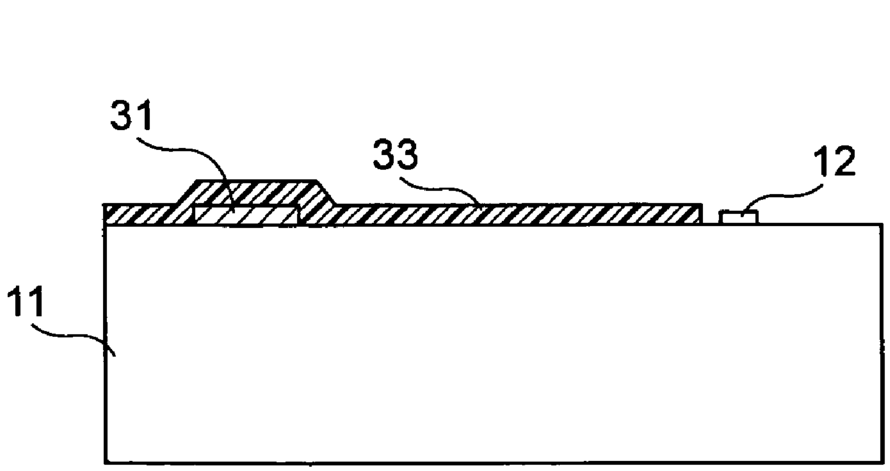
FIG. 3 is a sectional view showing a state in which an adhesive layer is formed over the entire surface of a substrate including a PAD electrode.

Instead of the protective layer 32 formed only in a region covering the PAD electrode 31, as shown in FIG. 2, an adhesive layer 33 composed of photoresistive resist may be applied over the entire surface of the substrate 11 including the PAD electrode 31 by spin coating or the like and patterned by photolithography to leave a film on the PAD film, as shown in FIG. 3. The adhesive layer 33 is formed for increasing the adhesiveness between the substrate 11 and a coating resin layer 35 which will be described below. In this case, the adhesive layer 33 may be used as the protective layer 32 for the PAD electrode 31.

Figure 4:
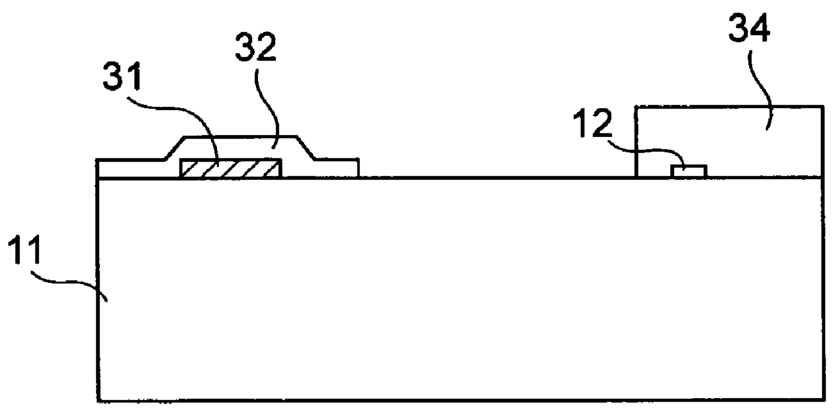
FIG. 4 is a sectional view showing a state in which a soluble resin layer is formed on a heating element.

Next, as shown in FIG. 4, a soluble resin layer 34 (sacrifice layer) is applied on a region including the heating elements 12 by spin coating or the like, and patterned by photolithography to form a flow path pattern. The soluble resin layer 34 is used as a portion for forming ink chambers 14 and individual flow paths 15.

Figure 5:
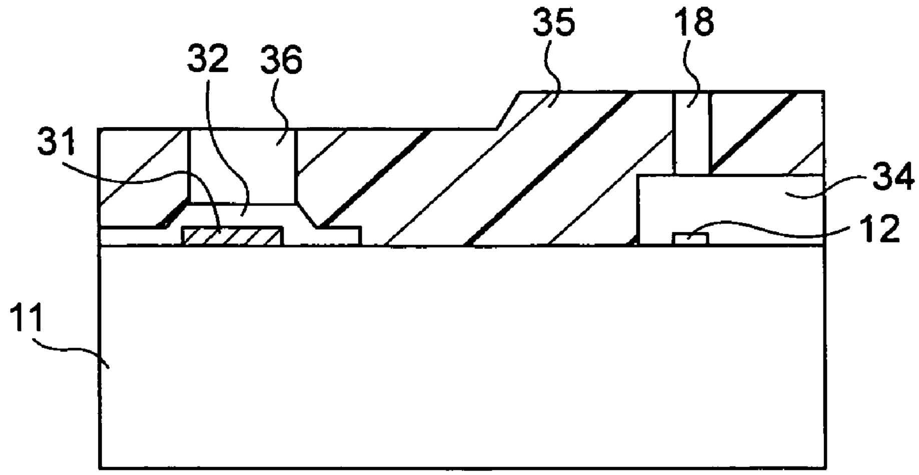
FIG. 5 is s sectional view showing a state in which a coating resin layer is formed on a soluble resin layer.

Next, as shown in FIG. 5, the coating resin layer 35 composed of, for example, photosensitive resist is applied over substantially the entire surface of the substrate 11 including the soluble resin layer 34 by spin coating or the like. Then, nozzles 18 (ejection holes) are formed in the coating resin layer 35 by photolithography so as to position directly above the respective heating elements 12. In this case, as shown in FIG. 5, a photomask is previously designed so that an opening 36 is formed in the coating resin layer 35 above the PAD electrode 31.

Next, the substrate 11 is cut into respective chips using, for example, a dicer or the like. In this case, cutting is performed so that at least a portion of cut lines overlaps with the soluble resin layer 34, thereby exposing the soluble resin layer 34 in a section after cutting.

Figure 6:
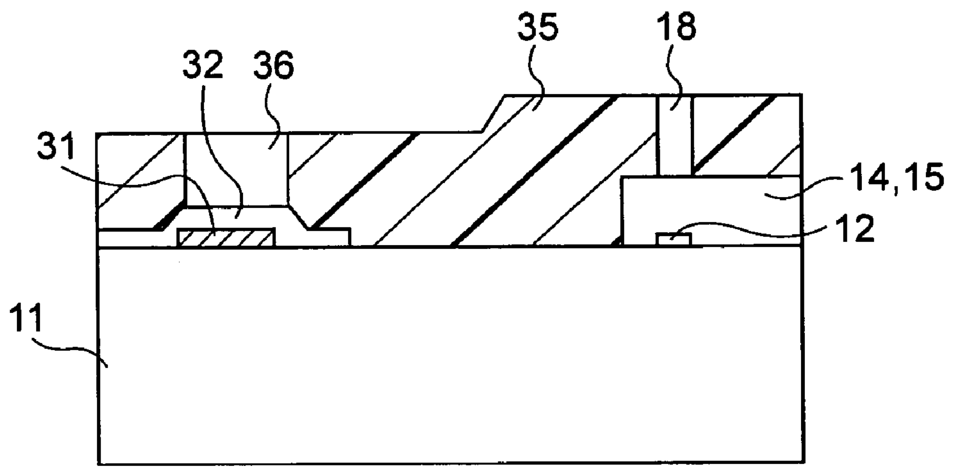
FIG. 6 is a sectional view showing a state in which a soluble resin layer is dissolved to form an ink chamber and an individual flow path.

Next, the resultant chip is dipped in an dissolving liquid for the soluble resin layer 34 to dissolve the soluble resin layer 34 starting from the section (left end in FIG. 5) of the exposed soluble resin layer 34, leaving only the coating resin layer 35 as a structure on the substrate 11, as shown in FIG. 6. As a result, a space is formed in the portion in which the soluble resin layer 34 has been present, and the ink chambers 14 and the individual flow paths 15 are formed in the inkjet head 10.

As the dissolving liquid, an alkaline aqueous solution (for example, 2 to 3% aqueous solution of tetramethylammonium hydroxide) which is used as a developer for the soluble resin layer 34 is used. In this case, the soluble resin layer 34 is completely dissolved without leaving the soluble resin layer in the flow paths. Also, since the PAD electrode 31 is covered with the protective layer 32, the PAD electrode 31 is not corroded with the alkaline aqueous solution.

Figure 7:
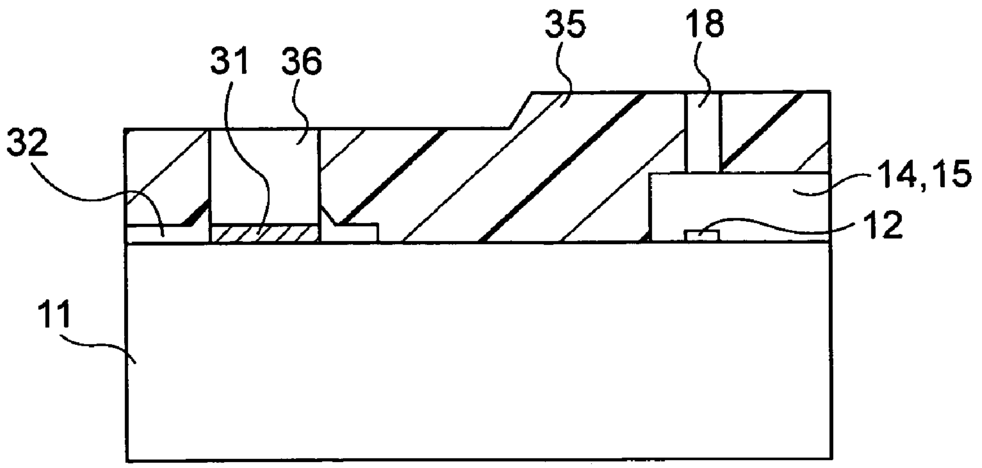
FIG. 7 is a sectional view showing a state in which a protective layer is removed.

Next, as shown in FIG. 7, the protective layer 32 is removed from the entire surface of the substrate 11 by oxygen plasma treatment using the pattern of the coating resin layer 35 as a mask. As described above, the protective layer 32 has a thickness of about 1 to 2 μm which is significantly smaller than the thickness (about 20 μm) of the coating resin layer 35, and thus the coating resin layer 35 is not lost by the oxygen plasma treatment of the entire surface of the substrate as long as the treatment is performed under conditions for removing the protective layer 32. As a result, the PAD electrode 31 is exposed. Although the protective layer 32 is partially left below the coating resin layer 35, the PAD electrode itself is exposed to the outside, thereby causing no problem.

A chip formed as described above includes the heating elements 12 serving as energy generating elements, the ink chambers 14 containing the heating elements 12, and the nozzles 18 formed at the tops of the ink chambers 14.

Next, the chip is disposed at a predetermined space from the ink supply member 21 having the supply port 22 and composed of a material, for example, aluminum, stainless steel, ceramic, or a resin. Also, the space is covered by thermocompression boding of the top plate 24 to which an adhesive has been previously applied, the top plate 24 being composed of a resin film of polyimide, PET, or the like, or a metal foil of nickel, aluminum, stainless steel, or the like. Consequently, the common flow path 23 is formed for supplying the ink to each of the individual flow paths 15 from the supply port 22, and thereby the inkjet head 10 (FIG. 1) is formed.

EXAMPLE

An example of the invention will be described below.

A negative photoresist for the protective layer 32 was applied in a thickness of 1 μm on a silicon wafer on which the heating elements 12 serving as energy generating elements had been formed. Then, the photoresist was exposed to light with a mask aligner.

Then, the photoresist was patterned by development and rinsing to leave a film on the PAD electrode 31 and further post-baked at 200° C. for improving water resistance.

Next, positive photoresist PMER-LA900 (manufactured by Tokyo Ohka Kogyo Co., Ltd.) was applied in a thickness of 10 μm by spin coating and exposed to light with a mask aligner.

Then, the photoresist was developed with a developer (3% aqueous solution of tetramethylammonium hydroxide) and then rinsed with pure water to form a flow path pattern. Then, the entire surface of the resist pattern was exposed to light with the mask aligner and then naturally allowed to stand in a nitrogen atmosphere for 24 hours.

Next, a photocurable negative photoresist was applied on the resist pattern by spin coating at a rotational speed controlled so that the thickness on the soluble resin layer 34 was 10 μm. Next, the photoresist was exposed to light with the mask aligner, developed with a developer (OK73 thinner, manufactured by Tokyo Ohka Co., Ltd.), and rinsed with a rinse (IPA) to form the nozzles 18 having a diameter of 15 μm at desired positions and the opening 36 above the PAD electrode 31.

Next, the wafer was diced into respective chip sizes with a dicer. In this dicing, a positive photoresist photomask was previously designed so that dicing lines overlapped with the patterned positive photoresist.

Then, each of the chips was dipped in a 3% aqueous solution of tetramethylammonium hydroxide serving as a developer for positive photoresist under ultrasonic vibrations until the positive photoresist was completely dissolved.

Then, pure water replacement and drying were carried out.

Furthermore, the chip was treated with oxygen plasma to remove the negative photoresist (protective layer 32) on the PAD electrode 31.

Next, the chip was attached to the ink supply portion 21 and covered with the top plate 24 made of a polyimide film, and a printed board for driving the chip was connected to the PAD electrode 31 on the chip by wire bonding. The connection was sealed with an epoxy adhesive so as to prevent contact with ink.

As a result of an ink ejection test using the inkjet head 10 formed as described above, white stripes due to non-ejection of the ink were not observed.

Although an embodiment of the invention has been described above, the invention is not limited to the embodiment, and the following various modifications may be made:

(1) Although, in the above-described embodiment, the inkjet head 10 is described, the invention is not limited to this. For example, the liquid to be ejected is not limited to ink, and the invention may be applied to liquid injection heads for ejecting various liquids.

For example, the invention may be applied to a liquid ejection head for ejecting a dye to a substance to be dyed. Also, the invention may be applied to a liquid ejection head for ejecting a DNA-containing solution used for detecting a biological sample.

(2) Although, in the above-described embodiment, the inkjet head 10 is a thermal system inkjet head using the heating elements 12 as energy generating elements, the head is not limited to this. Namely, the energy generating element is not limited the heating element 12, and the invention may be applied to a piezo system inkjet head using piezo elements as energy generating elements.

It should be understood by those skilled in the art that various modifications, combinations, sub-combinations and alterations may occur depending on design requirements and other factors insofar as they are within the scope of the appended claims or the equivalents thereof.

What is claimed is:

1. A process for manufacturing a liquid ejection head including an energy generating element formed on a substrate for applying energy to a liquid; a liquid chamber containing the energy generating element and the liquid to be ejected; a nozzle for ejecting the liquid contained in the liquid chamber; and an electrode formed on the substrate for achieving electrical connection to the outside, the process comprising the steps of:

forming a protective layer in a region of the substrate including the electrode;

forming a soluble resin layer in a region including a region of the substrate where the energy generating element has been formed, for forming the liquid chamber;

forming a coating resin layer in a region covering the soluble resin layer and a region above the electrode where an opening is formed in the coating resin layer;

forming an opening in the coating resin layer above the energy generating element to form the nozzle;

dipping the substrate in a dissolving liquid to dissolve the soluble resin layer; and removing the protective layer after dissolution of the soluble resin layer.

2. The process according to claim 1, comprising providing an adhesive layer in a region of the substrate including the electrode, for bonding the coating resin layer and the substrate together, the adhesive layer being used as the protective layer.

3. The process according to claim 1 or 2, wherein an alkaline aqueous solution is used as the dissolving liquid for dissolving the soluble resin layer.

4. The process according to claim 1, wherein the protective layer is removed by oxygen plasma treatment over the entire surface of the substrate.

5. The process according to claim 2, wherein the protective layer is removed by oxygen plasma treatment over the entire surface of the substrate.

6. The process according to claim 3, wherein the protective layer is removed by oxygen plasma treatment over the entire surface of the substrate.

* * * * *